(12) United States Patent
Kageshima

(10) Patent No.: US 8,356,195 B2
(45) Date of Patent: Jan. 15, 2013

(54) ARCHITECTURE VERIFYING APPARATUS, METHOD FOR VERIFYING ARCHITECTURE, AND COMPUTER READABLE MEDIUM COMPRISING COMPUTER PROGRAM CODE FOR VERIFYING ARCHITECTURE

(75) Inventor: Atsushi Kageshima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 389 days.

(21) Appl. No.: 12/730,110

(22) Filed: Mar. 23, 2010

(65) Prior Publication Data
US 2010/0313047 A1    Dec. 9, 2010

(30) Foreign Application Priority Data
Jun. 9, 2009    (JP) .................. 2009-138223

(51) Int. Cl.
*G06F 1/32*    (2006.01)
*G06F 15/50*    (2006.01)

(52) U.S. Cl. ........ 713/320; 713/300; 716/100; 716/108; 716/109; 716/132; 716/133; 716/136; 716/138

(58) Field of Classification Search .................. 713/300, 713/320; 716/100, 108, 109, 132, 133, 136, 716/138
See application file for complete search history.

(56) References Cited

U.S. PATENT DOCUMENTS

| | | | |
|---|---|---|---|
| 5,784,600 A * | 7/1998 | Doreswamy et al. ......... | 713/503 |
| 2002/0147553 A1 * | 10/2002 | Shimazaki et al. ............ | 702/65 |
| 2004/0025129 A1 * | 2/2004 | Batchelor ........................ | 716/6 |
| 2006/0282233 A1 * | 12/2006 | Pasricha et al. ................... | 703/1 |
| 2008/0077381 A1 * | 3/2008 | Baumgartner et al. ......... | 703/15 |
| 2008/0104564 A1 * | 5/2008 | Lin et al. ........................... | 716/6 |
| 2009/0001960 A1 * | 1/2009 | Scotten .......................... | 323/318 |
| 2009/0171645 A1 * | 7/2009 | Yoshida ......................... | 703/15 |
| 2010/0180240 A1 * | 7/2010 | Davis et al. ....................... | 716/5 |
| 2010/0269075 A1 * | 10/2010 | Tonti et al. ........................ | 716/4 |

FOREIGN PATENT DOCUMENTS

JP    2007-207120    8/2007

OTHER PUBLICATIONS

Background Art Information.

* cited by examiner

*Primary Examiner* — Vincent Tran
(74) *Attorney, Agent, or Firm* — Knobbe, Martens Olson & Bear LLP

(57) ABSTRACT

An architecture verifying apparatus includes an input unit receiving a time limit of a semiconductor integrated circuit including modules and buses, and performance specifications of the modules, a bus monitor acquiring bus transactions issued to the buses by the modules, a module monitor acquiring input transactions used when the module inputs data, processing information indicating processing contents and processing time used when the module processes the data, and output transactions used when the module outputs the processed data, a first architecture generator associating the processing information with the bus transaction, the input transaction, the processing information, and the output transaction, to generate a first architecture fulfilling the time limit, a second architecture generator changing the processing time of the first architecture, to generate a second architecture fulfilling the time limit and having power consumption lower than power consumption of the first architecture, and an output unit outputting the second architecture.

20 Claims, 12 Drawing Sheets

(A)

| OPERATION FREQUENCY [MHz] | PROCESSING TIME [ns] | POWER CONSUMPTION [mW] |
|---|---|---|
| 100 | 100 | 10 |
| 50 | 200 | 5 |
| 33.3 | 300 | 3.3 |

(B)

| SOURCE VOLTAGE [V] | PROCESSING TIME [ns] | POWER CONSUMPTION [mW] |
|---|---|---|
| 5 | 100 | 10 |
| 3.3 | 150 | 4.1 |
| 3 | 170 | 3.6 |
| 2 | 250 | 1.6 |

FIG. 7

| | REDUCED VALUE OF POWER CONSUMPTION [mW] | EXECUTION COUNT [%] | REDUCTION EFFECT |
|---|---|---|---|
| 1 | 100 | 60 | 60 |
| 2 | 90 | 30 | 18 |
| 3 | 200 | 10 | 20 |
| TOTAL | 390 | 100 | 98 |

FIG. 12

ARCHITECTURE VERIFYING APPARATUS, METHOD FOR VERIFYING ARCHITECTURE, AND COMPUTER READABLE MEDIUM COMPRISING COMPUTER PROGRAM CODE FOR VERIFYING ARCHITECTURE

CROSS-REFERENCE TO RELATED APPLICATION

This application is based upon and claims the benefit of priority from the prior Japanese Patent Application No. 2009-138223, filed on Jun. 9, 2009; the entire contents of which are incorporated herein by reference.

BACKGROUND OF THE INVENTION

1. Field of the Invention

The present invention relates to an architecture verifying apparatus, a method for verifying an architecture of a semiconductor integrated circuit, and a computer readable medium comprising a computer program code for verifying the architecture. In particular, the present invention relates to an architecture verifying apparatus, a method for verifying an architecture of a system LSI (Large Scale Integration), and a computer readable medium comprising a computer program code for verifying the architecture, which are used as tools for assisting to analyze the architecture.

2. Related Art

In ordinarily, performance of a system LSI largely depends upon an architecture of a system in use. Therefore, it is necessary to analyze the architecture of the system LSI in order to evaluate the performance of the system LSI.

For analyzing the architecture, however, it is necessary to regard a large amount of parameters such as selection of a processor included in the system, assignment of each processing executed on the system to the processor, processing time of each processing assigned to the processor, data transfer time on a bus, priority of the bus, the bus width, a bus arbitration method, the kind of a processor in use, and the operation frequency of the processor in use. Therefore, it is substantially impossible for a user to determine the architecture which fulfills specifications.

On the other hand, the architecture verifying apparatus is conventionally known as a tool used to assist to analyze the architecture when the user determines the architecture. The conventional architecture verifying apparatus makes a model operate on a simulator or a real machine to implement the architecture which is a candidate, acquire bus transactions issued to a bus, bus use wait information due to bus conflict, and throughput latency information of the bus, and display those kinds of information graphically to assist to make a determination whether the architecture fulfills specifications and to evaluate the architecture However, it is difficult for the user to make a determination whether the architecture fulfills the specifications based on only those kinds of information. As a technique for solving such a problem, therefore, a technique in which application information and bus transactions are linked is known (see JP-A 2007-207120 (KOKAI)). According to the technique disclosed in JP-A 2007-207120 (KOKAI), the user can easily make a determination whether the architecture fulfills the specifications.

According to the technique disclosed in JP-A 2007-207120 (KOKAI), however, information concerning a change to be made on the architecture which does not fulfill the specifications in order to make the architecture fulfill the specifications is not given to the user. Therefore, it is necessary for the user to determine the architecture which fulfills the specifications through trial and error. As a result, the user's burden in the analysis of the architecture increases and the work time period required for the analysis becomes long.

On the other hand, in system LSI in recent years, importance of reduction of the power consumption has increased.

However, in the conventional architecture analysis, it is noted whether the architecture fulfills a time limit. Therefore, the architecture which fulfills the time limit is not necessarily the architecture which has the excellent power consumption. Furthermore, for designing an architecture which fulfills the time limit and which is low in power consumption, the user must go through trial and error. As a result, the user's burden for designing such an architecture increases and the work time becomes long.

BRIEF SUMMARY OF THE INVENTION

According to a first aspect of the present invention, there is provided an architecture verifying apparatus comprising:

an input unit configured to receive a time limit of a semiconductor integrated circuit comprising a plurality of modules and a plurality of buses, and performance specifications of the modules;

a bus monitor configured to acquire bus transactions issued to the buses by the modules;

a module monitor configured to acquire input transactions used when the module inputs data, processing information indicating processing contents and processing time used when the module processes the data, and output transactions used when the module outputs the processed data;

a first architecture generator configured to associate the processing information with the bus transaction, the input transaction, the processing information, and the output transaction, to generate a first architecture fulfilling the time limit;

a second architecture generator configured to change the processing time of the first architecture, to generate a second architecture fulfilling the time limit and having power consumption lower than power consumption of the first architecture; and an output unit configured to output the second architecture.

According to a second aspect of the present invention, there is provided a method for verifying an architecture, the method comprising:

receiving a time limit of a semiconductor integrated circuit comprising a plurality of modules and a plurality of buses, and performance specifications of the modules;

acquiring bus transactions issued to the buses by the modules;

acquiring input transactions used when the module inputs data, processing information indicating processing contents and processing time used when the module processes the data, and output transactions used when the module outputs the processed data;

associating the processing information with the bus transaction, the input transaction, the processing information, and the output transaction to generate a first architecture fulfilling the time limit;

changing the processing time of the first architecture, to generate a second architecture fulfilling the time limit and having power consumption lower than power consumption of the first architecture; and outputting the second architecture.

According to a third aspect of the present invention, there is provided a computer readable medium comprising a computer program code for verifying an architecture, the computer program code comprising:

receiving a time limit of a semiconductor integrated circuit comprising a plurality of modules and a plurality of buses, and performance specifications of the modules;

acquiring bus transactions issued to the buses by the modules;

acquiring input transactions used when the module inputs data, processing information indicating processing contents and processing time used when the module processes the data, and output transactions used when the module outputs the processed data;

associating the processing information with the bus transaction, the input transaction, the processing information, and the output transaction to generate a first architecture fulfilling the time limit;

changing the processing time of the first architecture, to generate a second architecture fulfilling the time limit and having power consumption lower than power consumption of the first architecture; and outputting the second architecture.

BRIEF DESCRIPTION OF THE DRAWINGS

FIG. 7 is a table indicating a relationship between operation frequency or source voltage, processing time, and power consumption.

FIG. 12 is the reduction effect output by the output unit 10g of FIG. 11.

DETAILED DESCRIPTION OF THE INVENTION

Hereafter, embodiments of the present invention will be described more specifically with reference to the drawings.

First Embodiment

A first embodiment of the present invention will now be described. In the first embodiment, an architecture which fulfills a time limit and which is low in power consumption is designed from an architecture which fulfills the time limit.

Figure 1:
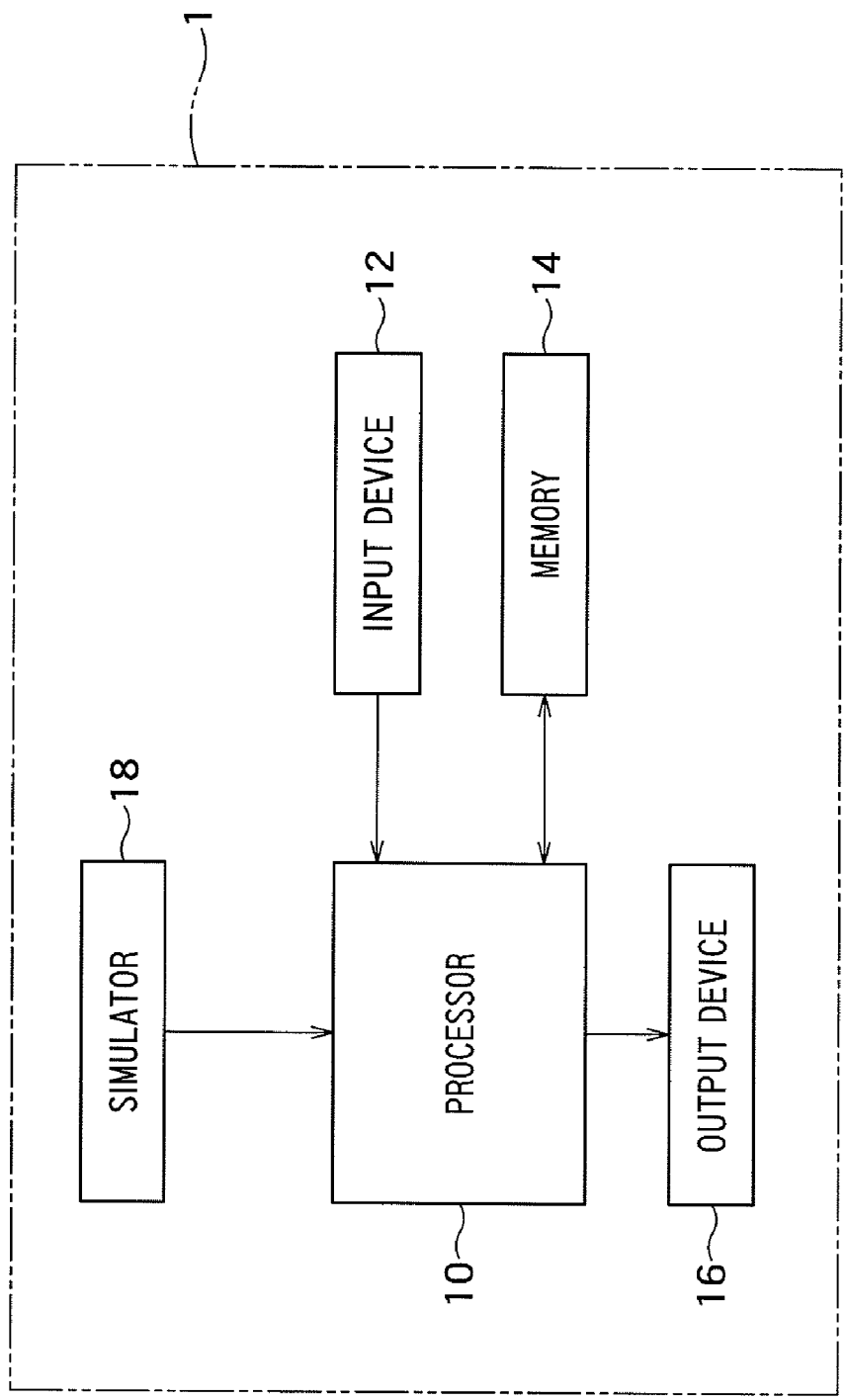
FIG. 1 is a block diagram showing a configuration of an architecture verifying apparatus according to the first embodiment of the present invention.
Figure 2:
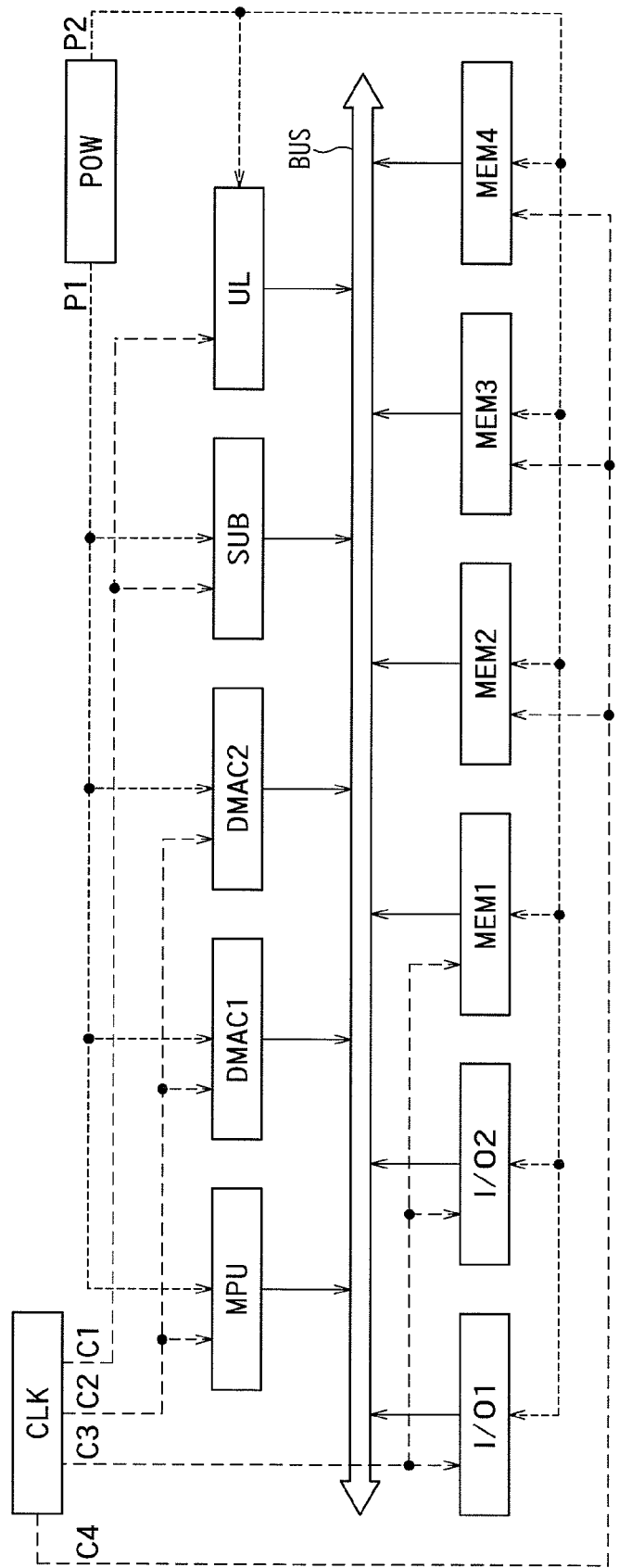
FIG. 2 is a block diagram showing an architecture to be verified by the architecture verifying apparatus 1 of FIG. 1.
Figure 3:
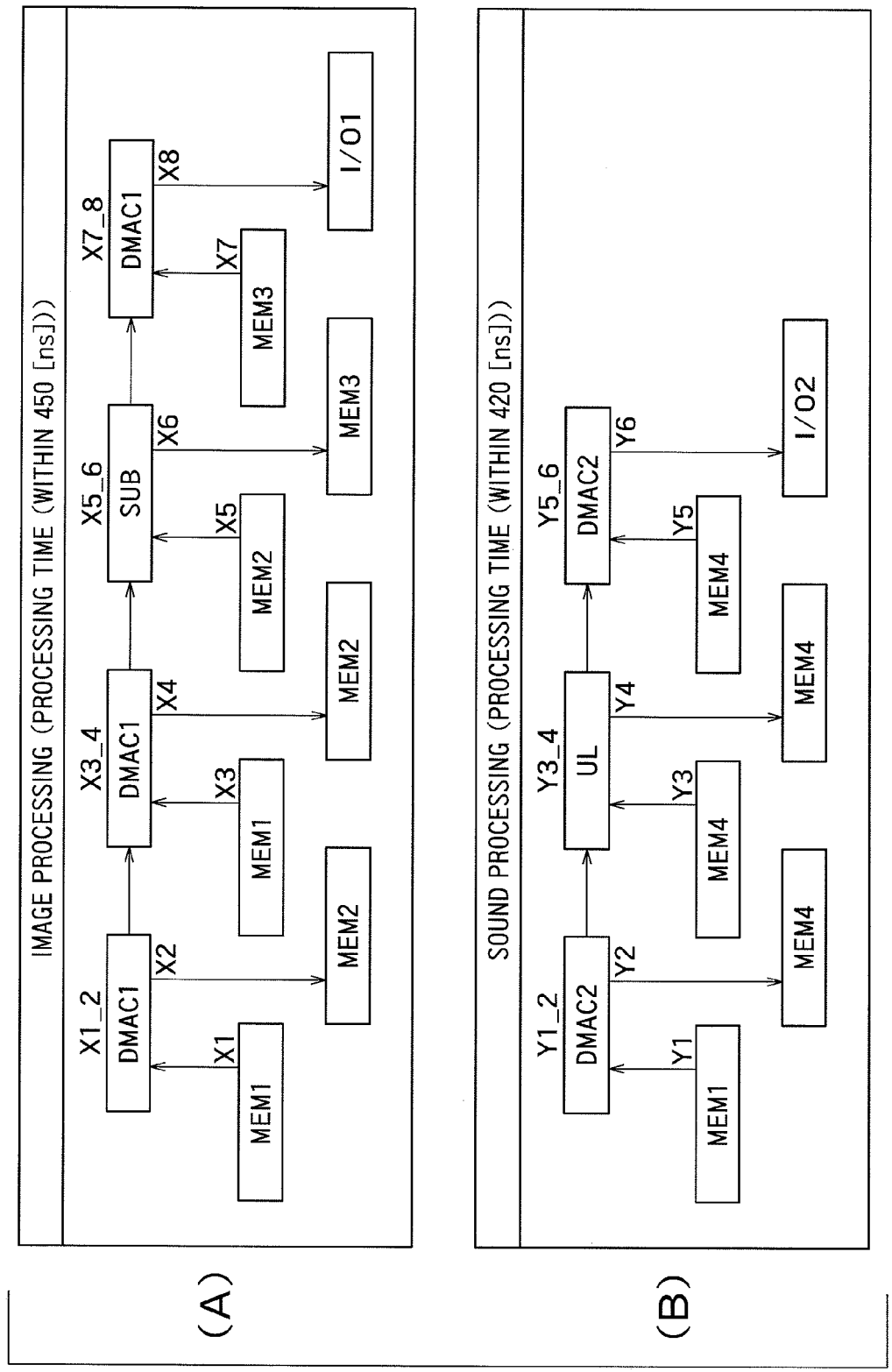
FIG. 3 is a block diagram schematically showing image processing and sound processing executed in the architecture of FIG. 2.
Figure 4:
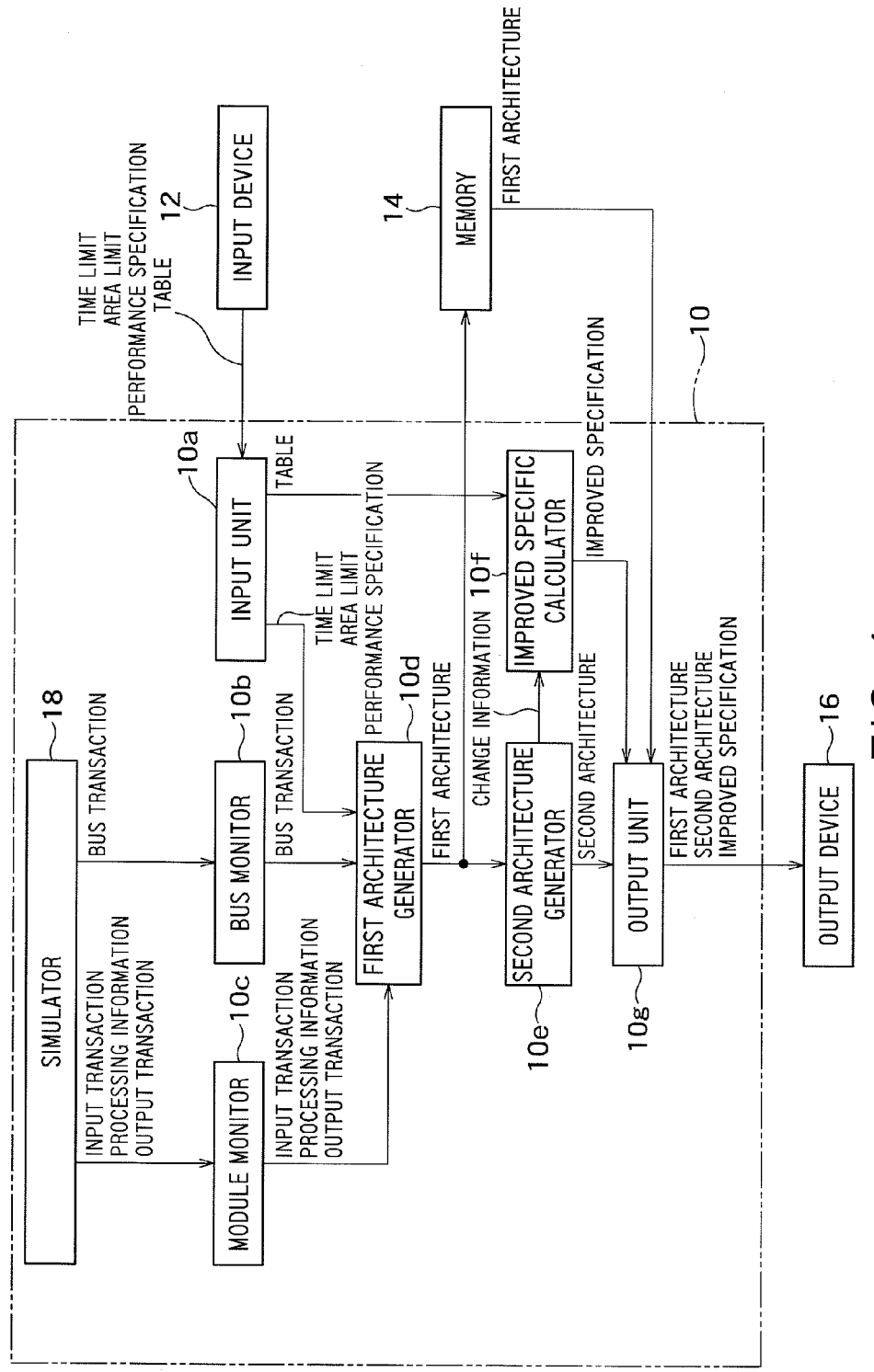
FIG. 4 is a block diagram showing functions implemented by a processor 10 of FIG. 1.

A configuration of an architecture verifying apparatus according to the first embodiment will now be described. FIG. 1 is a block diagram showing a configuration of an architecture verifying apparatus according to the first embodiment of the present invention. FIG. 2 is a block diagram showing an architecture to be verified by the architecture verifying apparatus 1 of FIG. 1. FIG. 3 is a block diagram schematically showing image processing and sound processing executed in the architecture of FIG. 2. FIG. 4 is a block diagram showing functions implemented by a processor 10 of FIG. 1.

As shown in FIG. 1, the architecture verifying apparatus 1 includes a processor 10 configured to be capable of executing various kinds of processing, an input device 12 such as a keyboard or a mouse, a memory 14 such as a hard disc, an output device 16 such as a liquid crystal display, a printer or a network device, and a simulator 18 configured to execute simulation. The processor 10 is configured to start a simulation program stored in the memory 14 and implement the simulator 18. An architecture of a semiconductor integrated circuit to be verified by the architecture verifying apparatus 1 is configured to operate on the simulator 18 and execute a plurality of kinds of processing (for example, image processing and sound processing) in parallel.

As shown in FIG. 2, the architecture to be verified by the architecture verifying apparatus 1 of FIG. 1 includes a plurality of modules (a processor MPU, memory controllers DMAC1 and DMAC2, a subprocessor SUB, an user logic UL, memories MEM1 to MEM4, and input-output interfaces I/O1 and I/O2), a bus, a clock generator CLK, and a power source POW.

Modules are connected to each other via a bus. Each module operates as an initiator module or a target module, and exchanges transactions to execute a series of processing. At this time, each module issues a bus transaction to the bus, an input transaction used when inputting data, processing to be executed on data, and an output transaction used when outputting data. Modules may be connected via a plurality of buses by a bus bridge. Each module is supplied with a predetermined frequency (C1: 100 [MHz], C2: 200 [MHz], C3: 50 [MHz], or C4: 50 [MHz]) from the clock generator CLK, and supplied with a predetermined source voltage (P1: 3.3 [V] or P2: 5 [V]) from the power source POW.

As shown in FIG. 3(A), in image processing executed in the architecture of FIG. 2, the memory controller DMAC1 issues an input transaction X1 when image data is read from the memory MEM1, executes processing X1_2 when the read image data is transferred to a work area, and issues an output transaction X2 when the processed image data is written into the memory MEM2. Then, the memory controller DMAC1 repeats similar processing to issue an input transaction X3, processing X3_4, and an output transaction X4. Then, the subprocessor SUB issues an input transaction X5 when image data is read from the memory MEM2, executes processing X5_6 when image processing is executed on the read image data, and issues an output transaction X6 when the processed image data is written into the memory MEM3. Then, the memory controller DMAC1 issues an input transaction X7 when image data is read from the memory MEM3, executes processing X7_8 when the image data is output to the outside the architecture, and issues an output transaction X8 when the processed image data is transmitted to the input-output interface I/O. A time limit on the series of processing is within 450 [ns].

As shown in FIG. 3(B), in sound processing executed in the architecture of FIG. 2, the memory controller DMAC2 issues an input transaction Y1 when sound data is read from the memory MEM1, executes processing Y1_2 when the read sound data is transferred to a work area, and issues an output transaction Y2 when the processed sound data into the memory MEM4. Then, the user logic UL issues an input transaction Y3 when sound data is read from the memory MEM4, executes processing Y3_4 when sound processing is executed on the read sound data, and issues an output transaction Y4 when the processed sound data is written into the memory MEM4. Then, the memory controller DMAC2 issues an input transaction Y5 when sound data is read from the memory MEM4, executes processing Y5_6 when the read sound data is output to the outside the architecture, and issues an output transaction Y6 when the processed sound data is transmitted to the input-output interface I/O2. A time limit on the series of processing is within 420 [ns].

As shown in FIG. 4, the processor 10 of FIG. 1 starts an architecture verifying program stored in the memory 14 to implement an input unit 10a which inputs various kinds of information from the input device 12, a bus monitor 10b which monitors a bus on the simulator 18, a module monitor 10c which monitors a module on the simulator 18, a first architecture generator 10d which generates an architecture (hereafter referred to as "first architecture") fulfilling a time limit and performance specifications, a second architecture generator 10e which generates an architecture different from the first architecture (hereafter referred to as "second architecture"), an improved specification calculator 10f which calculates performance specifications required to implement the second architecture (hereafter referred to as "improved specifications"), and an output unit 10g which outputs various kinds of information to the output device 16.

The input unit 10a of FIG. 4 is configured to receive various kinds of information from the input device 12, and supply them to the first architecture generator 10d and the improved specification calculator 10f. For example, information supplied to the first architecture generator 10d is a limit of the processing time of the architecture (hereafter referred to as "time limit"), a limit of the area of the architecture (hereafter referred to as "area limit"), and performance specifications for operating the modules in the architecture (for example, an operation frequency of the processor and a source voltage to be supplied to the processor). Information supplied to the improved specification calculator 10f are tables which indicate relations between the performance specifications and power consumption (see FIGS. 7(A) and 7(B)).

The bus monitor 10b of FIG. 4 is configured to monitor buses on the simulator 18 and acquire bus transactions (such as pair information which indicates a combination of an initiator module and a target module concerning a bus transaction, bus wait information due to bus conflict, throughput latency information of a bus, a data quantity of a bus transaction, and the number of times of transfer). For example, the bus monitor 10b acquires the pair information from an initiator module which issues a bus transaction and a target module which corresponds to an address contained in the transaction. Especially as for a bus transaction which passes through a plurality of buses via a bus bridge or the like, the bus monitor 10b monitors an address contained in the bus transaction and traces a bus transaction to an address space in the bus bridge or a bus transaction transferred to a different bus via a bus bridge to acquire pair information which indicates all combinations of relevant modules.

The module monitor 10c of FIG. 4 is configured to monitor modules on the simulator 18 and acquire input transactions issued by the modules, processing information concerning processing of the modules, and output transactions issued by the modules. For example, the module monitor 10c acquires the processing order in a series of processing and identification information of a module used in each processing (for example, "MPU" when the processor MPU of FIG. 2 is used) from information of an application program executed on the processor MPU which controls the series of processing. As regards processing executed on the processor MPU, the subprocessor SUB, or the user logic UL, the module monitor 10c monitors a required time elapsed since an instruction in a start section of a code of an application program corresponding to the processing is executed until an instruction in an end section is executed to acquire processing time, and an input transaction and an output transaction concerning the processing. On the other hand, as for processing executed on hardware, the module monitor 10c monitors a time period required elapsed since hardware which executes the processing is brought into an operation state due to an external cause until the hardware is brought into an end state to acquire the processing time and the input transaction and the output transaction concerning the processing.

Figure 6:
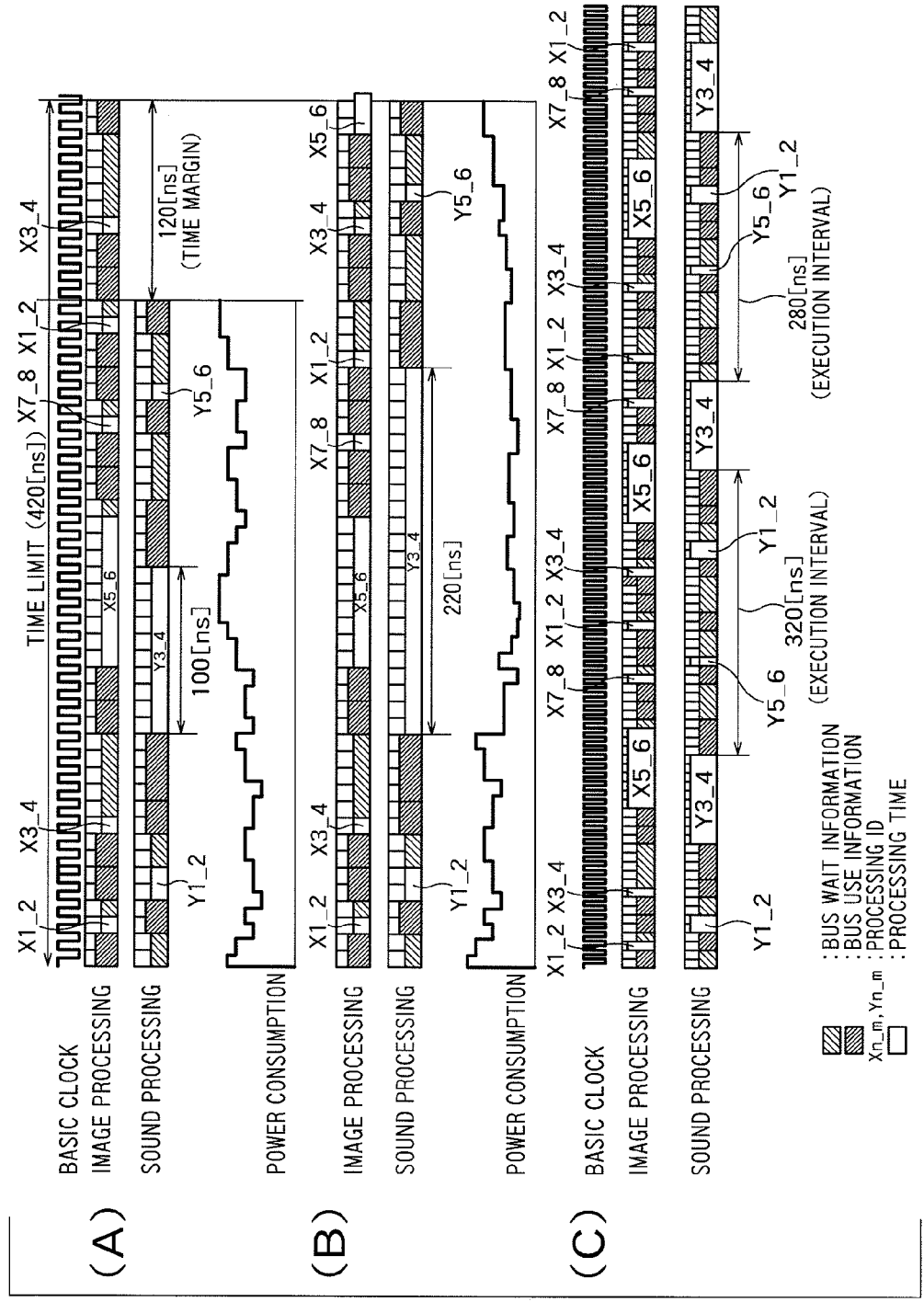
FIG. 6 is a schematic view of the second architecture according to the first embodiment of the present invention.

The first architecture generator 10d of FIG. 4 is configured to associate the time limit and performance specifications with a bus transaction, an input transaction, processing information, and an output transaction, generate the first architecture which fulfills the time limit and performance specifications (see FIG. 6(A)), write the first architecture into the memory 14, and supply the first architecture to the second architecture generator 10e. For example, as regards a plurality of architectures, the first architecture generator 10d groups an input transaction, processing information, and an output transaction concerning one processing, couples bus transactions among a plurality of groups, and sets a time limit as a threshold to generate the first architecture.

The second architecture generator 10e of FIG. 4 is configured to change the processing time of the first architecture, generate a second architecture (see FIG. 6(B)) which fulfills a time limit and has power consumption than that of the first architecture, and supply the second architecture to the output unit 10g. For example, the second architecture generator 10e prolongs the processing time of the first architecture to generate the second architecture. In the second architecture, the power consumption becomes low in places where the processing time is longer as compared with the first architecture.

The second architecture generator 10e of FIG. 4 is configured to supply processing time change information to the improved specification calculator 10f when the second architecture is generated.

The improved specification calculator 10f of FIG. 4 is configured to calculate improved specifications required to implement the second architecture based on change information when the second architecture is generated, by using tables (see FIGS. 7(A) and 7(B)), and supply the improved specifications to the output unit 10g.

The output unit 10g of FIG. 4 is configured to output the first architecture, the second architecture, and the improved specifications to the output device 16.

Figure 5:
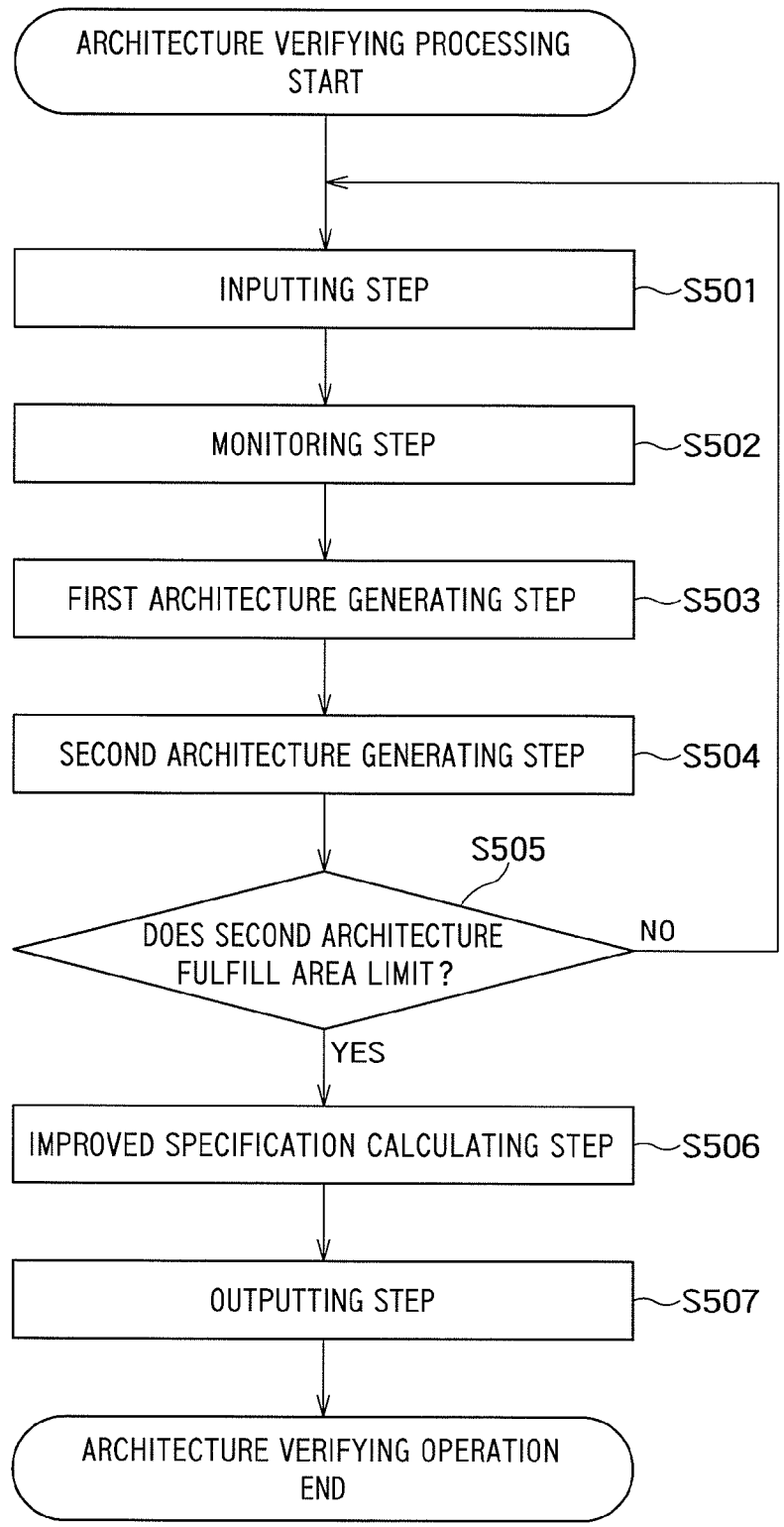
FIG. 5 is a flow chart showing a procedure of architecture verifying processing according to the first embodiment of the present invention.

Architecture verifying processing according to the first embodiment will now be described. FIG. 5 is a flow chart showing a procedure of architecture verifying processing according to the first embodiment of the present invention.

<FIG. 5: inputting step (S501)> The input unit 10a receives various kinds of information (time limit, area limit, performance specifications and tables) required for architecture verifying processing, which is fed by an user using the input device 12 of FIG. 1. The input unit 10a supplies the time limit, the area limit, and the performance specifications to the first architecture generator 10d and supplies the tables to the improved specification calculator 10f.

<FIG. 5: monitoring step (S502)> The simulator 18 simulates the case where a plurality of kinds of processing are executed on the architecture of FIG. 3. At this time, the bus monitor 10b monitors buses on the simulator 18, and the module monitor 10c monitors modules on the simulator 18. As a result, the bus monitor 10b acquires a bus transaction and supplies the bus transaction to the first architecture generator 10d, and the module monitor 10c acquires an input transaction, processing information and an output transaction, and supplies the input transaction, the processing information and the output transaction to the first architecture generator 10d.

<FIG. 5: first architecture generating step (S503)> The first architecture generator 10d associates the time limit and performance specifications, and a bus transaction with the input transaction, processing information and the output transaction, generates the first architecture (see FIG. 6(A)), writes the first architecture into the memory 14, and supply the first architecture to the second architecture generator 10e. At this time, the first architecture generator 10d generates an architecture of a plurality of architectures, which fulfills the time limit and area limit, as the first architecture.

As shown in FIG. 6(A), the first architecture indicates an architecture and a time limit for each of a plurality of kinds of processing (for example, image processing and sound processing). The architecture includes a bus transaction, an input transaction, processing information (processing order and processing time of each module), an output transaction, and a bus state (bus wait information and bus use information), which are arranged in a time series form.

<FIG. 5: second architecture generating step (S504)> The second architecture generator 10e generates a second architecture, supplies the second architecture to the output unit 10g, and supplies change information to the improved specification calculator 10f.

A first example of a second architecture generating step (S504) will now be described. The second architecture generator 10e calculates a difference (hereafter referred to as "time margin") between the time limit and processing time of the first architecture, and assigns the time margin to processing time to generate a second architecture. For example, in FIG. 6(A), the time margin is 120 [ns]. Therefore, the second architecture generator 10e changes processing time of processing Y3_4 executed by the user logic UL from 100 [ns] to 220 [ns] (that is, adds the time margin to the processing time of the processing Y3_4 executed by the user logic UL), and generates a second architecture (see FIG. 6(B)). At this time, the second architecture generator 10e supplies change information to the improved specification calculator 10f, which indicates that the processing time of the processing Y3_4 executed by the user logic UL has been changed from 100 [ns] to 220 [ns].

A second example of the second architecture generating step (S504) will now be described. The second architecture generator 10e generates a second architecture based on an execution interval of a module, a time period required to stop power supply to the module and resume the power supply to the module, and consumption of a control circuit which controls stopping power supply to the module and resuming the power supply to the module. At this time, the second architecture generator 10e supplies change information to the improved specification calculator 10f, which indicates that the processing Y3_4 executed by the user logic UL has been changed and the power supply stop time to the module (the user logic UL). For example, the second architecture 10e calculates the execution interval (320 [ns], 280 [ns]) of the processing Y3_4 executed by the user logic UL, and calculates an effect (hereafter referred to as "stop effect") in the case where power supply to the module (the user logic UL) executing noted processing (processing Y3_4) is stopped during the execution interval (see FIG. 6(c)). Specifically, the second architecture generator 10e calculates Expression 1. The left side of Expression 1 represents power consumption (merit of power supply stop) reduced when the power supply to the module is stopped. The right side of Expression 1 represents power consumption (demerit of power supply stop) required to stop the power supply to the module. That is, when Expression 1 is fulfilled, the merit of the power supply stop exceeds the demerit of the power supply, consequently the power supply stop is effective.

$$\{M-(A+B)\}*C>D \quad \text{Expression 1}$$

(M: execution interval, A: time period required to stop the power supply, B: time period required to resume the power supply, C: stop effect per unit time, and D: power consumption in the control circuit)

For example, when M=280 [ns], a second architecture which always stops power supply to a module forming noted processing (user logic UL) is generated. When M=300 [ns], a second architecture which stops power supply to a module forming noted processing (user logic UL) only when the execution interval is 320 [ns] is generated. That is, the second architecture generator 10e compares the merit with the demerit based on the execution interval of the module, the time period required to stop power supply to the module, and the time period required to resume the power supply to the module, and power consumption of the control circuit which controls power supply stopping to the module and power supply resuming to the module. When the merit is greater than the demerit, the second architecture generator 10e generates the second architecture.

<FIG. 5: S505> When the second architecture fulfills the area limit (S505—YES), the processing proceeds to the improved specification calculating step (S506). When the second architecture does not fulfill the area limit (S505—NO), the processing returns to the inputting step (S501). Specifically, a determination is made whether the area of the second architecture fulfills the area limit when additional control circuits (for example, when a new clock generator CLK and a new power source POW of FIG. 2 are installed) to control supply of source voltage to modules required to implement the second architecture is installed.

<FIG. 5: improved specification calculating step (S506)> The improved specification calculator 10f calculates performance specifications (the operation frequency of the processor and source voltage to be supplied to the processor) of the second architecture by using the table of FIG. 7(A) or 7(B). According to FIG. 7(A), it is appreciated that the operation frequency of the processor to implement the user logic UL can be changed from 100 [MHz] to 50 [MHz]. According to FIG. 7(B), it is appreciated that the source voltage to be supplied to the processor to implement the user logic UL can be changed from 5 [V] to 3 [V]. That is, the improved specifications are architecture parameters for reducing the power consumption in a range which fulfills the time limit and area limit with respect to the first architecture.

<FIG. 5: outputting step (S507)> The output unit 10g reads the first architecture stored in the memory 14, and outputs the first architecture, the second architecture, and improved specifications to the output device 16. After the outputting step (S507), the architecture verifying processing according to the first embodiment is completed.

A first modification of the first embodiment of the present invention will now be described. In the first embodiment, one second architecture and one set of improved specifications are generated for one first architecture. In the first modification, however, a plurality of second architectures and a plurality of sets of improved specifications are generated for a plurality of first architectures.

In the first modification, a first architecture generator 10*d* generates a plurality of first architectures which fulfill the time limit. A second architecture generator 10*e* generates a plurality of second architectures for each of a plurality of the first architectures. The improved specification calculator 10*f* calculates a plurality of specifications to implement each second architecture. The output unit 10*g* outputs a plurality of first architectures, a plurality of second architectures, and a plurality of sets of improved specifications.

A second modification of the first embodiment of the present invention will now be described. In the first embodiment, the time margin exists in one kind of processing (sound processing). In the second modification, however, a time margin exists in a plurality of kinds of processing (image processing and sound processing).

In the second modification, the second architecture generator 10*e* calculates the time margin for all cases and assigns a minimum value among time margins of all combinations to processing time of the noted processing (Y3_4).

Figure 8:
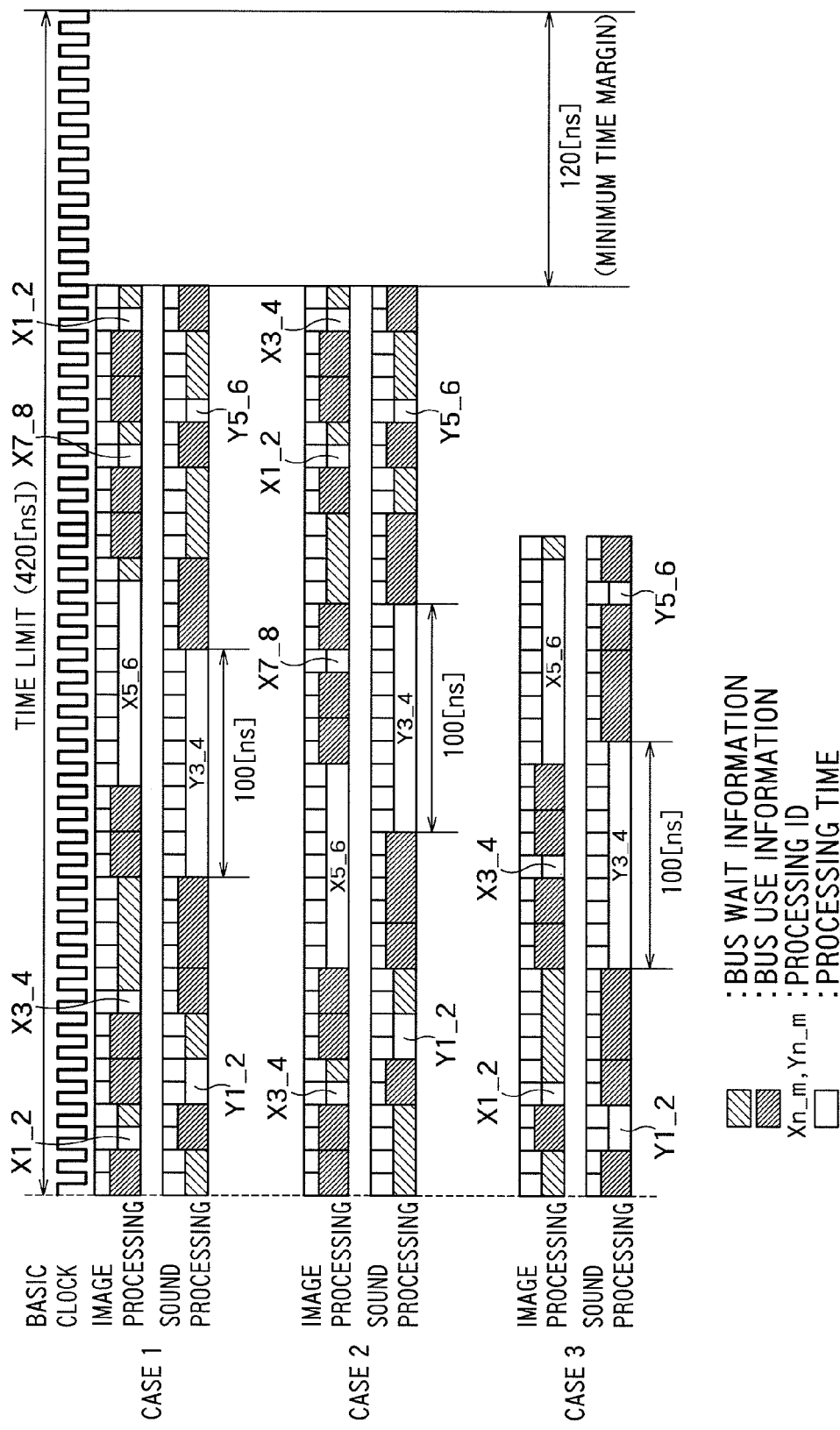
FIG. 8 shows the first architecture in three cases (case 1 to case 3) which differ in timing of image processing is executed when the image processing and the sound processing are executed in parallel.

FIG. 8 shows the first architecture in three cases (case 1 to case 3) which differ in timing of image processing is executed when the image processing and the sound processing are executed in parallel. The second architecture generator 10*e* calculates three time margins (case 1 and case 2: 120 [ns], case 3: 230 [ns]) for three first architectures, assigns a minimum time margin (120 [ns]), which is a minimum value among the three time margins, to processing time of the noted processing (Y3_4) in the pertinent case (the case 1 or the case 2), and generates the second architecture.

A third modification of the first embodiment of the present invention will now be described. In the first embodiment, the time margin is a fixed value. In the third modification, however, the time margin of the noted processing (Y3_4) varies according to execution timing (situation) of other processing (image processing).

In the third modification, the second architecture generator 10*e* assigns the time margin to the processing time of the noted processing (Y3_4) according to situation of other processing.

Figure 9:
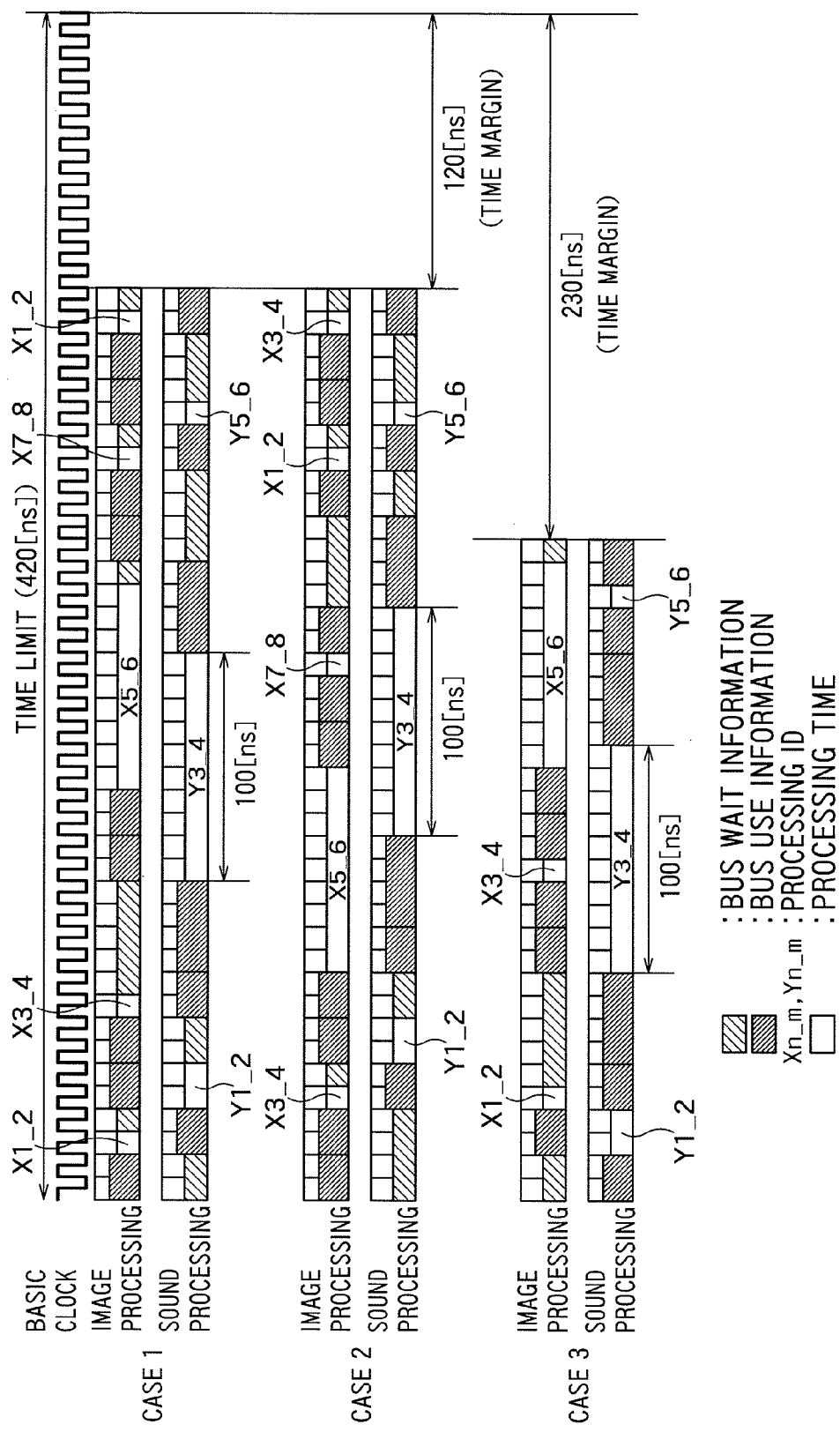
FIG. 9 shows the first architecture in three cases (case 1 to case 3) which differ in timing of image processing execution when the image processing and the sound processing are executed in parallel.

FIG. 9 shows the first architecture in three cases (case 1 to case 3) which differ in timing of image processing execution when the image processing and the sound processing are executed in parallel. The second architecture generator 10*e* calculates three time margins (case 1 and case 2: 120 [ns], case 3: 230 [ns]) for three first architectures, assigns each time margin to processing time of the noted processing (Y3_4) in each case, and generates a plurality of second architectures. In the second architecture, 120 [ns] is added to the processing time of the noted processing (Y3_4) in the case 1 and the case 2, and 230 [ns] is added to the processing time of the noted processing (Y3_4) in the case 3.

Figure 10:
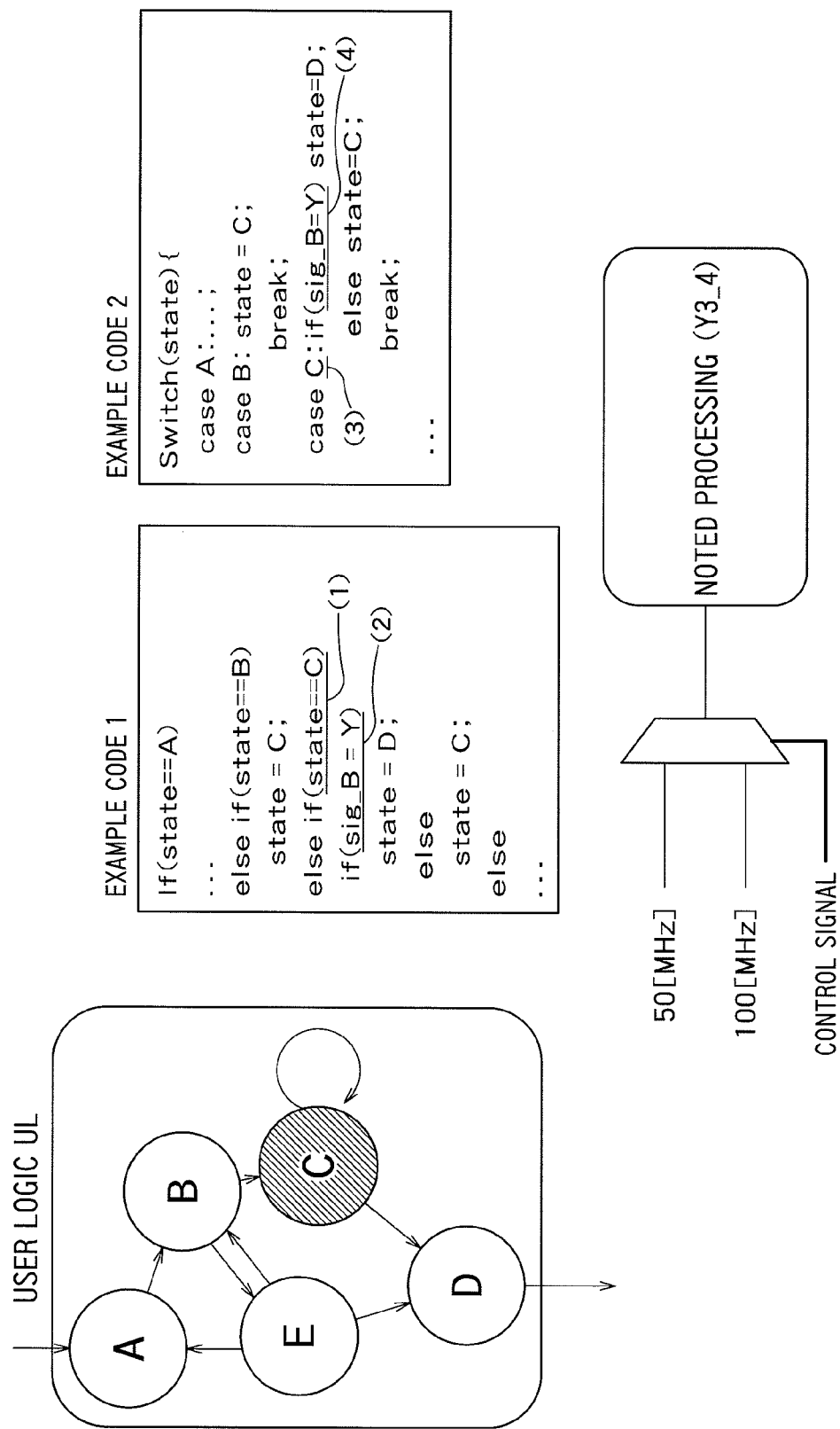
FIG. 10 is a schematic view of state machine according to the first embodiment of the present invention.

As shown in "USER LOGIC UL" of FIG. 10, a state in which a plurality of kinds of processing are combined is represented by a code (example code 1 and example code 2 of FIG. 10) of a state machine. Since the state machine is associated with a code which describes processing, it is possible to find conditions (see underlined parts (1) and (2) of FIG. 10) for entering a certain state and conditions (see underlined parts (3) and (4) of FIG. 10) for getting out of a certain state based on the code. The second architecture generator 10*e* finds these conditions, and generates a second architecture in which a control signal is supplied to the clock generator CLK and the power source POW of FIG. 2.

According to the first embodiment, the second architecture generator 10*e* calculates a time margin from the first architecture which fulfills the time limit, assigns the time margin to the noted processing, and generates a second architecture. Therefore, the user can easily construct an architecture which fulfills the time limit and which has low power consumption, and the work time period required for constructing the architecture can be reduced.

Furthermore, according to the first embodiment, the second architecture generator 10*e* makes a determination whether the area limit is fulfilled by considering an increase of area caused by installing an additional control circuit required to change the processing time of the noted processing. Therefore, the user can easily construct an architecture which fulfills not only the time limit but also the area limit and which has low power consumption, and the work time period required for constructing the architecture can be reduced.

Second Embodiment

A second embodiment of the present invention will now be described. The second embodiment is an example in which information regarding a reduction effect indicating a degree of reduced power consumption is generated. Contents similar to embodiments described above will not be repeated.

Figure 11:
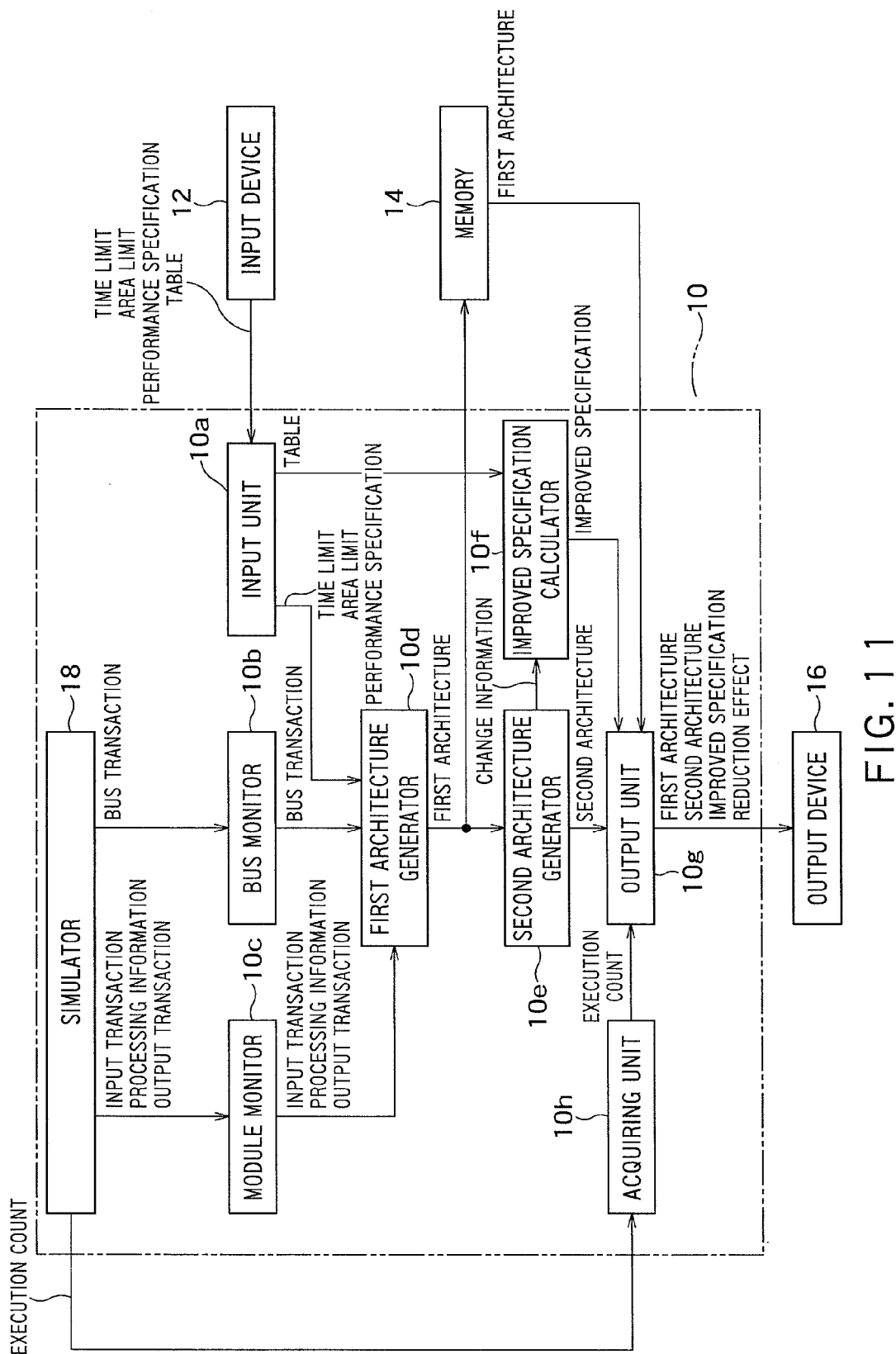
FIG. 11 is a block diagram showing functions implemented by the processor 10 of FIG. 1 according to the second embodiment of the present invention.

A configuration of an architecture verifying apparatus according to the second embodiment will now be described. FIG. 11 is a block diagram showing functions implemented by the processor 10 of FIG. 1 according to the second embodiment of the present invention.

As shown in FIG. 11, the processor 10 of FIG. 1 implements an input unit 10*a*, a bus monitor 10*b*, a module monitor 10*c*, a first architecture generator 10*d*, a second architecture generator 10*e*, an improved specification calculator 10*f*, and an output unit 10*g* in the same way as the first embodiment. In addition, the processor 10 starts an architecture verifying program stored in the memory 14 to implement an acquiring unit 10*h* which acquires an execution count of the module (that is, a frequency of processing) from the simulator 18.

The acquiring unit 10*h* of FIG. 11 is configured to monitor modules on the simulator 18, acquire execution counts of each module, and supply the execution counts to the output unit 10*g*.

The second architecture generator 10*e* of FIG. 11 is configured to generate a plurality of second architectures and supply the plurality of second architectures to the output unit 10*g* in a way similar to the first embodiment.

The output unit 10*g* of FIG. 11 is configured to output information regarding a reduction effect based on the execution count (the reduction effect indicates a degree of reduced power consumption of the second architecture as compared with the first architecture, see FIG. 12) with at least one of the plurality of second architectures to the output device 16.

According to the second embodiment, the output unit 10*g* outputs the information regarding the reduction effect of the execution count to the plurality of second architectures. Therefore, the user can easily appreciate differences among reduction effects of the plurality of second architectures. Especially, when a plurality of kinds of processing are in mutual dependence relations, the processing time of the noted processing adversely affect the processing time of other processing. Therefore, even if the power consumption of the noted processing is reduced, the power consumption as a whole may increase in some cases. The second embodiment is effective to such a case.

At least a portion of the architecture verifying apparatus according to the above-described embodiments of the present invention may be composed of hardware or software. When at least a portion of the architecture verifying apparatus is composed of software, a program for executing at least some functions of the architecture verifying apparatus may be stored in a recording medium, such as a flexible disk or a CD-ROM, and a computer may read and execute the program. The recording medium is not limited to a removable recording medium, such as a magnetic disk or an optical disk, but it may be a fixed recording medium, such as a hard disk or a memory.

In addition, the program for executing at least some functions of the architecture verifying apparatus according to the above-described embodiment of the present invention may be distributed through a communication line (which includes wireless communication) such as the Internet. In addition, the program may be encoded, modulated, or compressed and then distributed by wired communication or wireless communication such as the Internet. Alternatively, the program may be stored in a recording medium, and the recording medium having the program stored therein may be distributed.

The above-described embodiments of the present invention are just illustrative, but the invention is not limited thereto. The technical scope of the invention is defined by the appended claims, and various changes and modifications of the invention can be made within the scope and meaning equivalent to the claims.

What is claimed is:

1. An architecture verifying apparatus comprising:
   an input module configured to receive a time limit of a semiconductor integrated circuit comprising a plurality of modules and a plurality of buses, and performance specifications of the modules;
   a bus monitor configured to monitor bus transactions issued to the buses by the modules;
   a module monitor configured to monitor input transactions when the module inputs data, processing information indicating processing contents and processing time when the module processes the data, and output transactions when the module outputs the processed data;
   a first architecture generator configured to associate the processing information with the bus transaction, the input transaction, the processing information, and the output transaction, and to generate a first architecture fulfilling the time limit;
   a second architecture generator configured to change the processing time of the first architecture, and to generate a second architecture fulfilling the time limit and comprising power consumption lower than power consumption of the first architecture; and
   an output module configured to output the second architecture.

2. The apparatus of claim 1, wherein the second architecture generator is configured to assign a time margin substantially equal to a difference between the time limit and the processing time of the architecture to the processing time of the first architecture, and to generate the second architecture.

3. The apparatus of claim 2, wherein
   the input module is further configured to receive an area limit of the semiconductor integrated circuit, and
   the second architecture generator is configured to generate the second architecture fulfilling the area limit when a controller configured to operate the module is installed.

4. The apparatus of claim 3, further comprising a counter configured to receive an execution count of the module, wherein
   the output module is further configured to output information regarding a reduction effect indicating a degree of reduced power consumption of the second architecture as compared with the first architecture based on the execution count.

5. The apparatus of claim 2, further comprising a counter configured to receive an execution count of the module, wherein
   the output module is further configured to output information regarding a reduction effect indicating a degree of reduced power consumption of the second architecture as compared with the first architecture based on the execution count.

6. The apparatus of claim 1, wherein the second architecture generator is configured to generate the second architecture based on an execution interval of the module, a time period for stopping power supply to the module, a time period for resuming the power supply to the module, and power consumption of a controller in order to control the stopping and the resuming the power supply to the module.

7. The apparatus of claim 6, further comprising a counter configured to receive an execution count of the module, wherein
   the output module is further configured to output information regarding a reduction effect indicating a degree of reduced power consumption of the second architecture as compared with the first architecture based on the execution count.

8. The apparatus of claim 1, further comprising a counter configured to receive an execution count of the module, wherein
   the output module is further configured to output information regarding a reduction effect indicating a degree of reduced power consumption of the second architecture as compared with the first architecture based on the execution count.

9. A method for verifying an architecture verifying apparatus, the method comprising:
   receiving a time limit of a semiconductor integrated circuit comprising a plurality of modules and a plurality of buses, and performance specifications of the modules;
   monitoring bus transactions issued to the buses by the modules;
   monitoring input transactions when the module inputs data, processing information indicating processing contents and processing time used when the module processes the data, and output transactions used when the module outputs the processed data;
   associating the processing information with the bus transaction, the input transaction, the processing information, and the output transaction to generate a first architecture fulfilling the time limit;
   changing the processing time of the first architecture, and generating a second architecture fulfilling the time limit and comprising power consumption lower than power consumption of the first architecture; and
   outputting the second architecture.

10. The method of claim 9, wherein in generating the second architecture, a time margin substantially equal to a difference between the time limit and the processing time of the architecture to the processing time of the first architecture is assigned to the processing time of the first architecture.

11. The method of claim 10, wherein
an area limit of the semiconductor integrated circuit is further received with the time limit, and the second architecture fulfilling the area limit is generated when a controller configured to operate the module is installed.

12. The method of claim 11, further comprising receiving an execution count of the module, wherein
information regarding a reduction effect indicating a degree of reduced power consumption of the second architecture as compared with the first architecture based on the execution count is further output with the second architecture.

13. The method of claim 10, further comprising receiving an execution count of the module, wherein
information regarding a reduction effect indicating a degree of reduced power consumption of the second architecture as compared with the first architecture based on the execution count is further output with the second architecture.

14. The method of claim 9, wherein the second architecture is generated based on an execution interval of the module, a time period for stopping power supply to the module, a time period for resuming the power supply to the module, and power consumption of a controller in order to control the stopping and the resuming the power supply to the module.

15. The method of claim 14, further comprising receiving an execution count of the module, wherein
information regarding a reduction effect indicating a degree of reduced power consumption of the second architecture as compared with the first architecture based on the execution count is further output with the second architecture.

16. The method of claim 9, further comprising receiving an execution count of the module, wherein
information regarding a reduction effect indicating a degree of reduced power consumption of the second architecture as compared with the first architecture based on the execution count is further output with the second architecture.

17. A computer non-transitory machine readable storage medium comprising a computer program for verifying an architecture verifying apparatus, the computer program causes one or more computers to:
receive a time limit of a semiconductor integrated circuit comprising a plurality of modules and a plurality of buses, and performance specifications of the modules;
monitor bus transactions issued to the buses by the modules;
monitor input transactions when the module inputs data, processing information indicating processing contents and processing time when the module processes the data, and output transactions when the module outputs the processed data;
associate the processing information with the bus transaction, the input transaction, the processing information, and the output transaction and generate a first architecture fulfilling the time limit;
change the processing time of the first architecture, generate a second architecture fulfilling the time limit and comprising power consumption lower than power consumption of the first architecture; and
output the second architecture.

18. The medium of claim 17, wherein a time margin substantially equal to a difference between the time limit and the processing time of the architecture to the processing time of the first architecture is assigned to the processing time of the first architecture in order to generate the second architecture.

19. The medium of claim 18, wherein
an area limit of the semiconductor integrated circuit is further received with the time limit, and the second architecture fulfilling the area limit is generated when a controller configured to operate the module is installed.

20. The medium of claim 17, wherein the second architecture is generated based on an execution interval of the module, a time period for stopping power supply to the module, a time period for resuming the power supply to the module, and power consumption of a controller in order to control the stopping and the resuming the power supply to the module.

* * * * *